United States Patent
Lesea

(10) Patent No.: US 9,231,591 B1
(45) Date of Patent: Jan. 5, 2016

(54) DYNAMIC VOLTAGE SCALING IN PROGRAMMABLE INTEGRATED CIRCUITS

(71) Applicant: Xilinx, Inc., San Jose, CA (US)

(72) Inventor: Austin H. Lesea, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/568,899

(22) Filed: Dec. 12, 2014

(51) Int. Cl.
H03K 19/173 (2006.01)
H03K 19/00 (2006.01)
H03K 19/08 (2006.01)

(52) U.S. Cl.
CPC ............ *H03K 19/0016* (2013.01); *H03K 19/08* (2013.01)

(58) Field of Classification Search
CPC .............. H03K 19/1776; H03K 19/17728; H03K 19/0016
See application file for complete search history.

(56) References Cited

U.S. PATENT DOCUMENTS

| | | | |
|---|---|---|---|
| 7,622,961 B2 * | 11/2009 | Grochowski et al. | 327/20 |
| 2005/0251700 A1 * | 11/2005 | Henderson et al. | 713/401 |
| 2009/0206904 A1 * | 8/2009 | Shimura | 327/199 |
| 2009/0278564 A1 | 11/2009 | Dehon et al. | |
| 2012/0218005 A1 | 8/2012 | Chua-Eoan et al. | |
| 2014/0115408 A1 | 4/2014 | Ivan et al. | |
| 2014/0340134 A1 * | 11/2014 | Shionoiri | 327/198 |

FOREIGN PATENT DOCUMENTS

| EP | 2662791 | 11/2013 |
|---|---|---|
| WO | 2011109713 | 9/2011 |

OTHER PUBLICATIONS

Blaauw, David et al., "Razor II: In Situ Error Detection and Correction for PVT and SER Tolerance" *Proc. of the 2008 IEEE International Solid-State Circuits Conference*, Feb. 3, 2008, pp. 400-401, 622, IEEE, Piscataway, New Jersey, USA.
Chen, Chia-Hsiang et al., "Efficient In Situ Error Detection Enabling Diverse Path Coverage" *Proc. of the 2013 IEEE International Symposium on Circuits and Systems*, May 23, 2013, pp. 773-776, IEEE, Piscataway, New Jersey, USA.
Das, Shidhartha et al., "RazorII: In Situ Error Detection and Correction for PVT and SER Tolerance," *IEEE Journal of Solid-State Circuits*, Jan. 2009, pp. 32-48, vol. 44, No. 1, IEEE, Piscataway, New Jersey, USA.
Xilinx, *7 Series FPGAs Configurable Logic Block User Guide*, UG474 (v1.6), Aug. 11, 2014, pp. 1-74, Xilinx, Inc., San Jose, California, USA.
Xilinx, *UltraScale Architecture DSP Slice Advance Specification User Guide*, UG579 (v1.1), Jul. 15, 2014, pp. 1-72, Xilinx, Inc., San Jose, California, USA.

* cited by examiner

*Primary Examiner* — Jason M Crawford
(74) *Attorney, Agent, or Firm* — Kevin T. Cuenot

(57) ABSTRACT

An apparatus includes a first programmable circuit block including a plurality of programmable circuit elements. The plurality of programmable circuit elements include a hardwired, instrumented memory element. The instrumented memory element includes a first flip-flop configured to receive a data signal, a delay circuit configured to generate a delayed version of the data signal, and a second flip-flop identical to the first flip-flop and configured to receive the delayed version of the data signal. The instrumented memory element also may include a comparator configured to compare an output signal from the first flip-flop and an output signal from the second flip-flop and an error signal generator. The error signal generator is configured to generate an error signal responsive to a mismatch of bits between the output signal from the first flip-flop and the output signal from the second flip-flop.

13 Claims, 8 Drawing Sheets

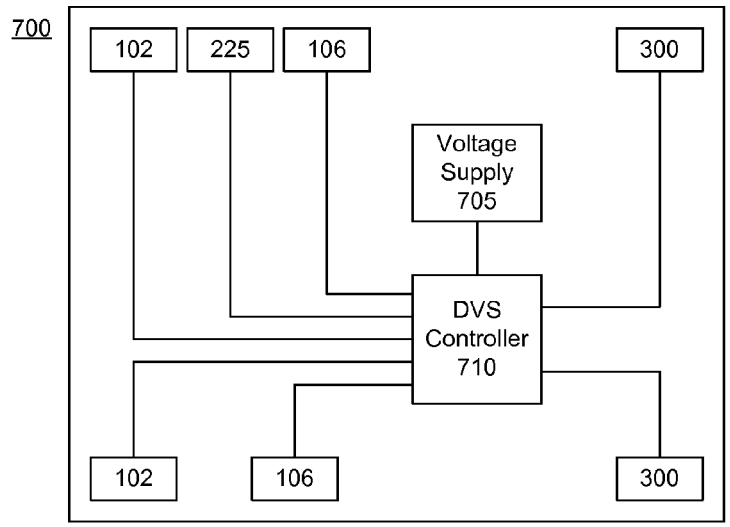
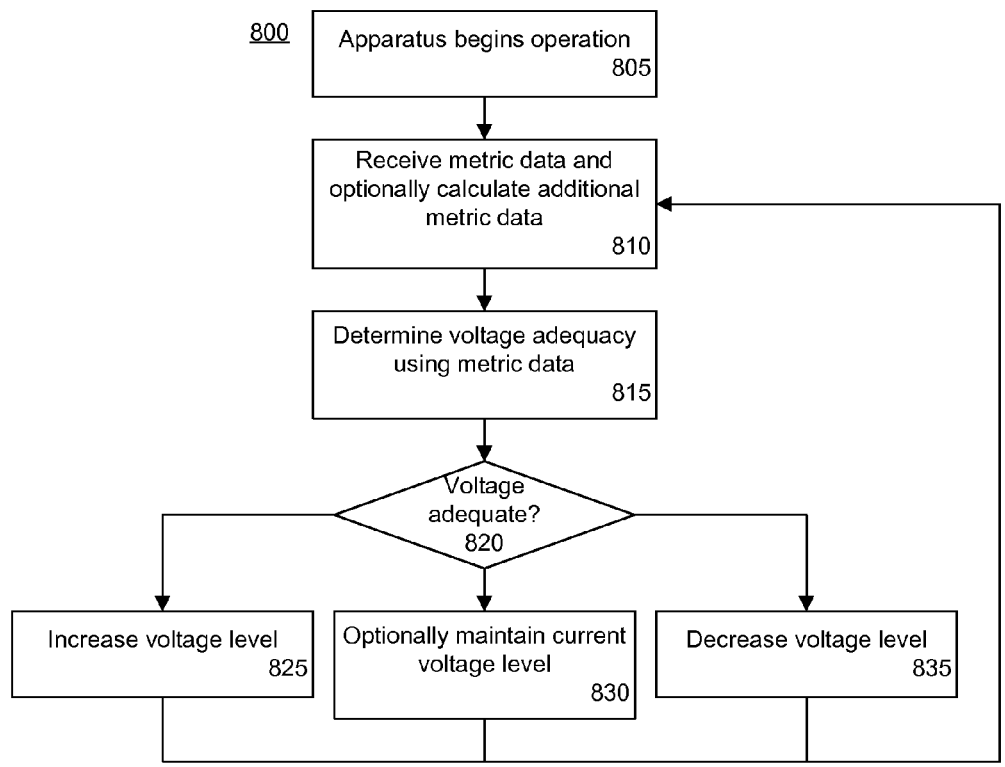
FIG. 7
FIG. 8

DYNAMIC VOLTAGE SCALING IN PROGRAMMABLE INTEGRATED CIRCUITS

TECHNICAL FIELD

This disclosure relates to integrated circuits (ICs) and, more particularly, to dynamic voltage scaling in programmable ICs.

BACKGROUND

Dynamic voltage scaling, or "DVS," is a power management technique used in electronic systems. DVS refers to varying the voltage provided to one or more components of an electronic system. The voltage may be varied in real time during operation of the electronic system according to various circumstances. As an example, the voltage provided to a component such as a central processing unit of an electronic system may be increased or decreased in real time during operation of the electronic system. Decreasing the voltage provided to a component may be performed to reduce power consumption of the electronic system or to conserve power.

A variety of techniques may be used to control DVS operations in electronic systems. In some cases, look-up tables are used to store pre-characterized voltages that guarantee either correct operation of the electronic system or operation with an acceptable error rate. In other cases, a "canary" circuit is implemented within the electronic system and monitored for errors. A canary circuit generally refers to a class of circuit used to indicate an imminent error or failure. When applied to an integrated circuit (IC), the noted DVS control techniques may be particularly susceptible to process, voltage, and temperature (PVT) variations across the IC. Accordingly, the design of an electronic system typically includes sufficient margin to maintain acceptable operation of the electronic system in even a worst case combination of PVT variation.

SUMMARY

An apparatus includes a first programmable circuit block including a plurality of programmable circuit elements. The plurality of programmable circuit elements include a hardwired, instrumented memory element. The hardwired, instrumented memory element includes a first flip-flop configured to receive a data signal, a delay circuit configured to generate a delayed version of the data signal, a second flip-flop identical to the first flip-flop and configured to receive the delayed version of the data signal, a comparator configured to compare an output signal from the first flip-flop and an output signal from the second flip-flop, and an error signal generator configured to generate an error signal responsive to a mismatch of bits between the output signal from the first flip-flop and the output signal from the second flip-flop.

An apparatus includes a programmable circuitry operable over a range of voltages of a power signal, a ring oscillator configured to generate an error signal having a frequency inversely correlated with an error rate of at least a portion of the programmable circuitry. The error rate is inversely correlated with a voltage of the power signal. The apparatus also includes a dynamic voltage scaling controller configured to vary the voltage of the power signal responsive to the frequency of the error signal from the ring oscillator.

A programmable circuit block includes a first look-up table having a first output and a second output, a first flip-flop configured to receive a first signal from the first output of the first look-up table, and a second flip-flop configured to receive a second signal from the second output of the first look-up table. The first signal may be a delayed version of the second signal. The programmable circuit block also includes a second look-up table configured to receive an output signal from the first flip-flop and an output signal from the second flip-flop. The second look-up table may be configured to generate an error signal responsive to a mismatch of bits between the output signal from the first flip-flop and the output signal from the second flip-flop.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 7 is a block diagram illustrating an exemplary IC including DVS circuitry.

FIG. 8 is a flow chart illustrating an exemplary method of operation of an apparatus including DVS enabled circuitry.

DETAILED DESCRIPTION

Figure 1:
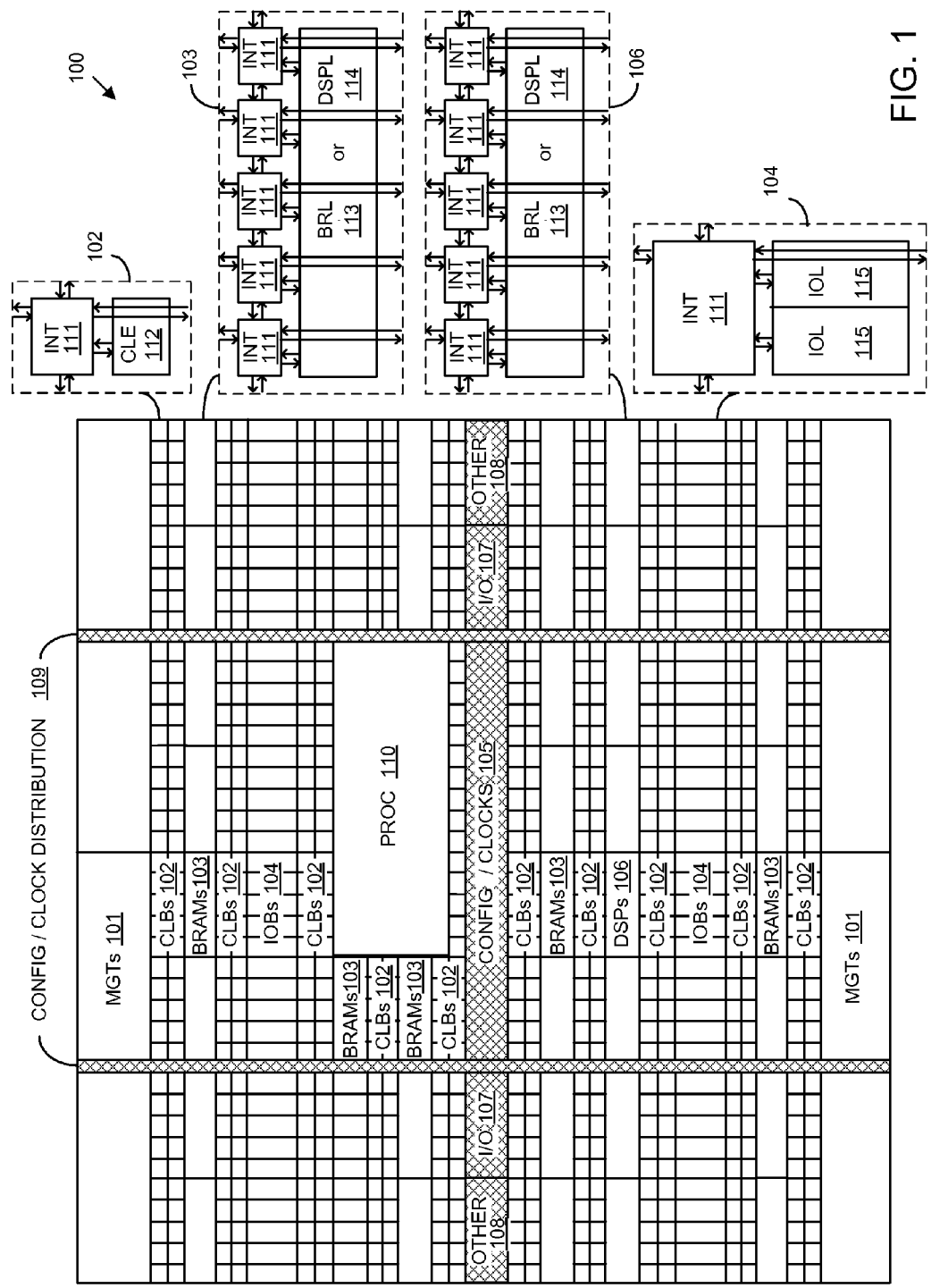
FIG. 1 is a block diagram illustrating an exemplary architecture for an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to dynamic voltage scaling in programmable ICs. In accordance with the inventive arrangements described herein, dynamic voltage scaling, or "DVS," is facilitated through the use of one or more circuit structures. The circuit structure(s), as implemented within the programmable IC, may be used to determine whether a voltage provided to one or more circuits of the programmable IC should be adjusted or varied, e.g., increased, decreased, or remain the same.

In one aspect, the circuit structures are configured to generate metric data. The metric data indicates whether the voltage provided to one or more circuits should be adjusted. Exemplary metric data generated by the circuit structures may include, but is not limited to, whether an error has occurred, an error rate, and/or frequency that is correlated with error rate and/or voltage.

The circuit structures may be automatically implemented within a circuit design and/or added to a circuit design using an electronic design automation (EDA) tool. In one aspect, the circuit structures may be implemented using programmable circuitry of the programmable IC. In another aspect, hardwired versions of one or more circuit structures may be used. The hardwired versions of the circuit structures may be incorporated into one or more programmable circuit blocks of a programmable IC and/or positioned at one or more different locations throughout the programmable IC. The circuit structures also may be included within one or more signal paths, e.g., timing critical signals paths, of a circuit design. In each case, the circuit structures may generate metric data to indicate when voltage of a power signal, or signals, has been reduced below an acceptable level for proper circuit operation.

The various circuit structures and techniques described within this disclosure facilitate improved control over DVS operations. The resulting electronic system is less susceptible to process, voltage, and temperature (PVT) fluctuations inherent to ICs. Accordingly, the need to design for the worst case scenario may be avoided as the resulting electronic system may dynamically adapt to conditions in real time.

The inventive arrangements described herein may be implemented as a method of operating upon a circuit design. The method may be performed by a data processing system. In another aspect, the inventive arrangements may be implemented as a data processing system having a processor. The processor, upon executing program code, operates upon a circuit design. In still another aspect, the inventive arrangements may be implemented as a non-transitory computer-readable storage medium storing program code that, when executed, causes a processor and/or a system to perform and/or initiate a method or process of operating upon a circuit design as described herein.

The inventive arrangements may also be implemented within an apparatus. In one aspect, the apparatus may be a programmable IC. In another aspect, the apparatus may be implemented as a larger system such as a vehicle, computing system, display, or the like that includes one or more programmable ICs having one or more of the circuit structures and/or features described herein. DVS, as implemented using the circuit structures and/or techniques described within this disclosure, may improve the overall efficiency and power consumption of the apparatus that is implemented.

Several definitions that apply throughout this document now will be presented. As used herein, the phrase "real time" means a level of processing responsiveness that a user or system senses as sufficiently immediate for a particular process or determination to be made, or that enables the processor to keep up with some external process.

As defined herein, the term "hardware description language" is a computer-language that facilitates the documentation, design, and manufacture of a digital system, such as an IC. A hardware description language, or "HDL," combines program verification techniques with expert system design methodologies. Using an HDL, for example, a user can design and specify an electronic system, describe the operation of the electronic system, and create tests to verify operation of the electronic system. An HDL includes standard, text-based expressions of the spatial and temporal structure and behavior of the electronic system, e.g., circuit, being modeled. HDL syntax and semantics include explicit notations for expressing concurrency. In contrast to most high level programming languages, an HDL also includes an explicit notion of time, which is a primary attribute of a digital system.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary architecture 100 for an IC. An IC may be implemented to perform a variety of functions. Some ICs may be programmed to perform specified functions.

One example of an IC that may be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Referring again to FIG. 1, architecture 100 may be implemented within a programmable IC. For example, architecture 100 may be implemented within an FPGA. Architecture 100 is also representative of a system-on-chip, or SOC, type of IC. An SOC is an IC that includes a processor that executes program code and one or more other circuits that do not execute program code. The circuits may operate cooperatively with one another and/or with the processor.

Architecture 100 includes several different types of programmable circuit, e.g., logic, blocks. For example, architecture 100 may include a large number of different programmable tiles including multi-gigabit transceivers (MGTs) 101, CLBs 102, BRAMs 103, input/output blocks (IOBs) 104, configuration and clocking logic (CONFIG/CLOCKS) 105, DSPs 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 may include a configurable logic element (CLE) 112 that may be programmed to implement user logic plus a single INT 111. A BRAM 103 may include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also may be used. A DSP tile 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, may be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks may be programmable blocks and/or dedicated circuitry. For example, a processor block depicted as PROC 110 spans several columns of CLBs and BRAMs.

In one aspect, PROC 110 is implemented as a dedicated circuitry, e.g., as a hardwired processor, that is fabricated as part of the die that implements the programmable circuitry of the IC. PROC 110 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks may be utilized to form a "soft processor" in that the various blocks of programmable circuitry may be used to form a processor that is operable to execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 may be considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC. PROC 110 may be an example of hardwired circuitry.

In some instances, hardwired circuitry may have one or more operational modes that may be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 110 or a soft processor. In some cases, architecture 100 includes a dedicated configuration processor that loads the configuration bitstream to the appropriate configuration memory cells and/or processor memory. In other cases, architecture 100 may utilize PROC 110 to receive the configuration bitstream, load the configuration bitstream into appropriate configuration memory cells, and/or extract program code for execution.

FIG. 1 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 110 within the IC are for purposes of illustration only and are not intended as limitations.

In one aspect, architecture 100 may include one or more DVS circuit structures. A "DVS circuit structure," as defined herein, means circuitry that generates metric data used to control dynamic voltage scaling within an electronic system. Examples of DVS circuit structures include instrumented circuit components, whether hardwired or formed using programmable circuit blocks, ring oscillators, whether hardwired or formed using programmable circuit elements, circuit structures configured to generate error signals responsive to inadequate voltage, and the like.

As used herein, an "instrumented circuit component" is a circuit component that is modified to indicate an imminent error in consequence of a DVS operation. An example of an instrumented circuit component is an instrumented flip-flop. An instrumented flip-flop may be hardwired or formed using programmable circuitry. The instrumented flip-flop may be implemented to include a first signal path and a second signal path. The second signal path is substantially similar to the first signal path, but includes a larger amount of propagation delay than the first signal path. The two signal paths may be compared at a same moment in time to determine whether the signal paths specify a same value. The second signal path, having increased delay, will typically exhibit an error prior to the first signal path as voltage is reduced. A mismatch between the values of the signal paths indicates an imminent error within the first signal path. The imminent error may be a result of a voltage reduction to the instrumented flip-flop through application of DVS in the electronic system.

One or more of the programmable circuit blocks implemented within architecture 100 may include a DVS circuit structure such as a hardwired, instrumented circuit component. Referring to FIG. 1, one or more CLBs 102 may be implemented to include one or more hardwired, instrumented circuit components. In another aspect, one or more CLBs 102 may be implemented to perform the functionality of an instrumented circuit component natively. In still another aspect, one or more DSPs 106 may be implemented to include one or more hardwired, instrumented circuit components. Any of the various programmable circuit blocks described with reference to FIG. 1 may include one or more hardwired, instrumented circuit components.

It should be appreciated that while the programmable circuit blocks, as a whole, are considered programmable circuitry, the instrumented circuit components within such programmable circuit blocks may be implemented as hardwired circuit structures. Further, only selected ones of the CLBs 102, DSPs 106, or the like may include instrumented circuit components. For example, an IC may include CLBs 102 and/or DSPs 106 where only a subset, i.e., one or more but less than all, of the programmable circuit blocks include an instrumented circuit component such as an instrumented flip-flop. In that case, fewer than all CLBs 102 may include instrumented circuit components and/or fewer than all DSPs 106 may include instrumented circuit components.

Architecture 100 also may include one or more ring oscillators (not shown). In some cases, one or more hardwired ring oscillators may be included within and/or throughout an IC for testing purposes. The ring oscillators may be included within an IC to determine a maximum operating frequency of the IC prior to sale. In general, such ring oscillators may not be available for use within, or as part of, user circuit designs once the IC passes testing and is provided to users.

In accordance with the inventive arrangements disclosed herein, one or more ring oscillators used for IC testing may also be made available for use within a user design to facilitate DVS. The frequency of operation of the ring oscillator may be used to indicate an imminent error. For example, frequency of the ring oscillator may be used to indicate an imminent error or an unacceptable error rate within circuitry. As such, the frequency of the ring oscillator may be monitored as voltage is varied. When the frequency decreases to a particular frequency threshold associated with either an unacceptable error rate or indicating an imminent error, the voltage of a power signal may be varied in response.

Figure 2:
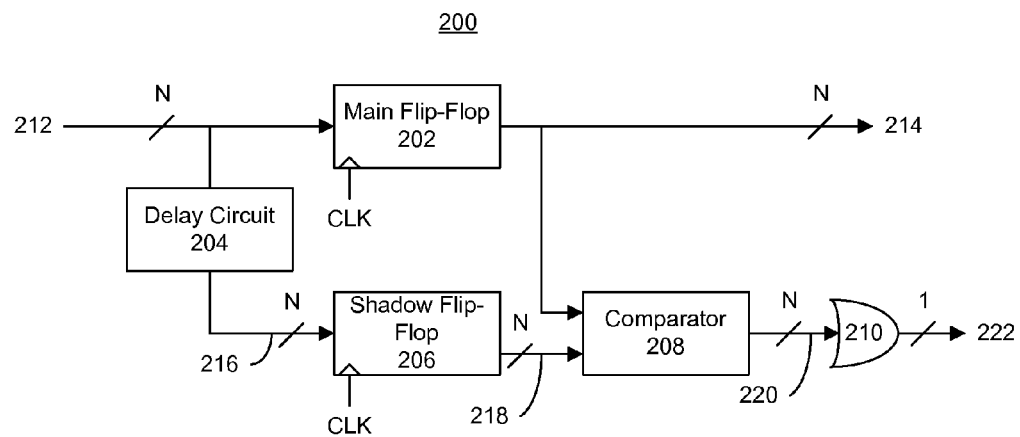
FIG. 2 is a block diagram illustrating an exemplary instrumented circuit component.

FIG. 2 is a block diagram illustrating an example of an instrumented circuit component. FIG. 2 illustrates an instrumented memory element and, in particular, an instrumented flip-flop 200. Instrumented flip-flop 200 may be implemented as a hardwired flip-flop within a programmable circuit block such as a CLB and/or a DSP. In another example, instrumented flip-flop 200 may be implemented using programmable circuitry of an IC, e.g., using two or more CLBs. In still another example, instrumented flip-flop 200 may be implemented by the native circuitry of a single CLB to be described herein in greater detail.

As pictured, instrumented flip-flop 200 includes a main flip-flop 202, a delay circuit 204, a shadow flip-flop 206, a comparator 208, and an OR circuit 210. In one aspect, main flip-flop 202 and shadow flip-flop 206 are identical flip-flops. Further, main flip-flop 202 and shadow flip-flop are clocked by a same clock signal depicted as "CLK."

A data signal 212 is provided to an input of main flip-flop 202 and to an input of delay circuit 204. An output of main flip-flop 202 generates output signal 214. Delay circuit 204 generates a delayed version of signal 212, which is illustrated as signal 216. Signal 216 is provided to an input of shadow flip-flop 206. Shadow flip-flop 206 outputs a result signal 218 that is provided to an input of comparator 208. Output signal 214 is also provided to an input of comparator 208. Accordingly, the first signal path of instrumented flip-flop flows from signal 212 to the input of comparator 208, while the second signal path flows from signal 212 to the second input of comparator 208.

Comparator 208 compares the received signals to determine whether the signals specify the same value. For example, comparator 208 may be configured to determine whether both signals 214 and 218 are the same value, e.g., both 0 or both 1, or specify different values, e.g., 0 and 1. In one example, comparator 208 may be implemented as an exclusive OR circuit. Comparator 208 generates a comparison result signal 220 that is provided to an input of OR circuit 210. OR circuit 210 performs a logical OR operation on the received comparison result signal 220. OR circuit 210 generates and outputs an error signal 222. As such, if any one of the bits of comparison result signal 220 has a value of one, OR circuit 210 outputs error signal 222 as a logic high or one value. When none of the bits of signal 220 are high, indicating that signals 214 and 218 match bit for bit, error signal 222 remains at a logic low or a zero value. Each of signals 212, 214, 216, 218, and 220 may be implemented as a multi-bit signal of N bits, where N is an integer value greater than one. Error signal 222 may be implemented as a single bit signal.

In operation, as the voltage provided to instrumented flip-flop 200 is continually lowered, at some point error signal 222 will go high when signals 214 and 218 disagree, e.g., are no longer identical. When signals 214 and 218 no longer match, the condition indicates that continuing to lower the voltage will cause an error in signal 214, which is to be avoided for proper or correct operation.

In one aspect, an additional memory element, e.g., a flip-flop, may be added to capture error signal 222. In one exemplary implementation, the additional memory element may be included as part of instrumented flip-flop 200. In another exemplary implementation, the additional memory element may be included within a DVS controller coupled to instrumented flip-flop 200.

Figure 3:
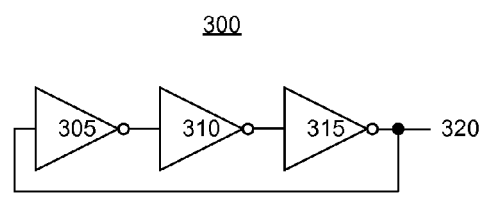
FIG. 3 is a block diagram illustrating an exemplary ring oscillator.

FIG. 3 is a circuit diagram illustrating an exemplary ring oscillator 300. In the example of FIG. 3, ring oscillator 300 includes three inverters 305, 310, and 315. Inverters 305, 310, and 315 are coupled serially with an output of inverter 315 being fed back as an input to inverter 305. Signal 320 is an output signal, e.g., an error signal, from ring oscillator 300. Signal 320 has a particular frequency of oscillation that may be used to determine whether voltage provided to ring oscillator 300 and other circuitry is adequate for correct operation. Ring oscillator 300 is provided for purposes of illustration only and is not intended as a limitation. Any of a variety of different ring oscillator circuit configurations may be used for purposes of generating frequency based metric data for purposes of DVS.

Figure 4:
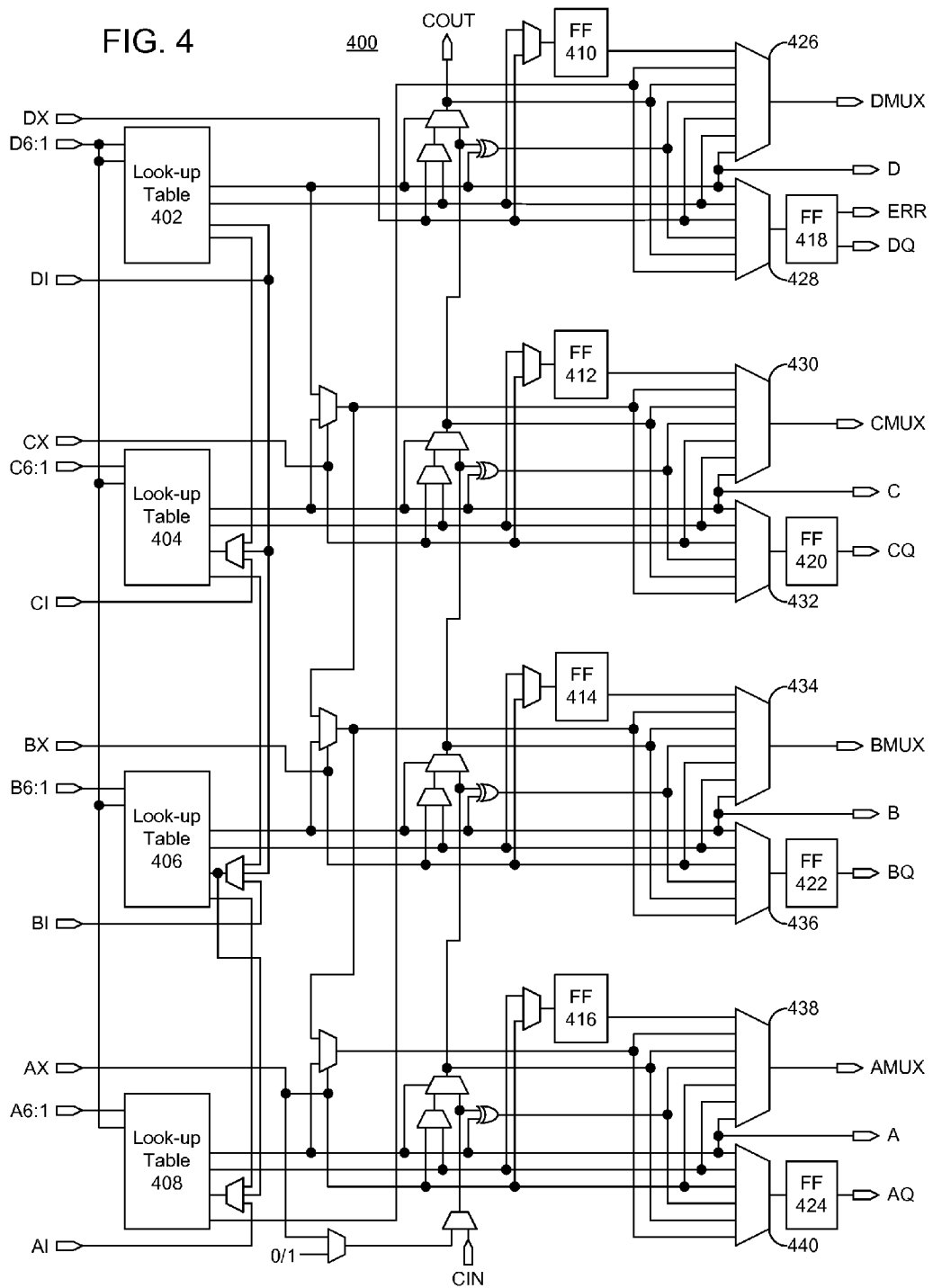
FIG. 4 is a block diagram illustrating an exemplary portion of a configurable logic block (CLB).

FIG. 4 is a block diagram illustrating an exemplary portion of a CLB referred to as a slice 400. A CLB such as CLB 102 may include multiple slices, e.g., two slices, and interconnect circuitry. Slice 400 includes a plurality of look-up tables (or logic function generators) 402, 404, 406, and 408, a first plurality of storage elements illustrated as flip-flops (FFs) 410, 412, 414, and 416, and a second plurality of storage elements illustrated as flip-flops 418, 420, 422, and 424. Slice 400 further includes multiple wide-function multiplexers 426, 428, 430, 432, 434, 436, 438, and 440.

In one example, look-up tables 402, 404, 406, and 408 may be implemented as six-input look-up tables. Each of look-up tables 402, 404, 406, and 408 may include six independent inputs and two independent outputs. Signals output from look-up tables 402, 404, 406, and 408 may exit slice 400 the A, B, C, or D outputs respectively or through multiplexer 428, 432, 436, or 440, respectively. Signals output from look-up tables 402, 404, 406, and 408 further may enter the XOR dedicated gates, enter the carry-logic chain (e.g., CIN and/or COUT), enter the select line of the carry-logic multiplexer, feed the data input of flip-flops 410, 412, 414, or 416, respectively, etc.

Other configurations may be implemented by loading appropriate configuration data into configuration memory cells that control the select lines of the multiplexers shown in slice 400 and by loading appropriate data into the various look-up tables 402, 404, 406, and 408. Further information and description for slice 400 may be found within "7 Series FPGAs CLB User Guide," UG474 (v1.6) Aug. 11, 2014, from Xilinx, Inc.

As pictured, the memory element illustrated as flip-flop 418 is implemented as an instrumented flip-flop. For example, flip-flop 418 may be implemented as a hardwired, instrumented flip-flop described with reference to FIG. 2. Flip-flop 418 includes an additional output not included in any of flip-flops 410, 412, 414, 416, 420, 422, or 424. In particular flip-flop 418 includes an error signal output in addition to the data output (DQ). The error signal output, depicted as the ERR signal within FIG. 4, may be provided to a DVS controller to be described herein in greater detail. In one aspect, the particular flip-flop, e.g., flip-flop 418, that is instrumented may be the particular circuit component of the programmable circuit block considered slower or slowest. In the case of slice 400, for example, flip-flop 418 may be part of the carry chain signal path of slice 400 as received from another CLB or the first or last flip-flop in a shift register configuration, both of which are considered slower signal paths through slice 400. The slower, or the slowest, circuit component(s) within a the programmable circuit block are often the most timing critical when lowering voltage since errors occur within the most timing critical signal paths prior to occurring in less critical signal paths of the programmable circuit block.

While flip-flop 418 is illustrated as a hardwired, instrumented flip-flop as described with reference to FIG. 2, it should be appreciated that one or more additional flip-flops may be implemented as hardwired, instrumented flip-flops. Any of the various flip-flops 410, 412, 414, 416, 418, 420, 422, and/or 424, and/or any combinations thereof, may be implemented as hardwired, instrumented flip-flops. Further, in the case where slice 400 includes a single, hardwired, instrumented flip-flop, the particular flip-flop that is implemented as a hardwired, instrumented flip-flop may be any of flip-flops 410, 412, 414, 416, 418, 420, 422, and/or 424. Further, since a CLB may include more than one slice, only one slice may include one or more instrumented flip-flops. In one aspect, in the case where slice 400, or a CLB, includes a plurality of hardwired, instrumented flip-flops, each such flip-flop may generate an error signal that may be provided to the DVS controller.

It should be appreciated that slice 400 is presented for purposes of illustration only. More complex CLB (or CLB slices) and/or less complex CLB (or CLB slices) may be used and include one or more instrumented circuit components. The look-up tables, for example, may include fewer or more inputs and/or output, etc. Further, in one aspect, each flip-flop within the programmable circuit block may be implemented as a hardwired, instrumented flip-flop. As discussed within FIG. 4, however, this need not be the case. In one aspect, only those flip-flops considered to be slower, or slowest within the programmable circuit block may be implemented as instrumented flip-flops.

Figure 5:
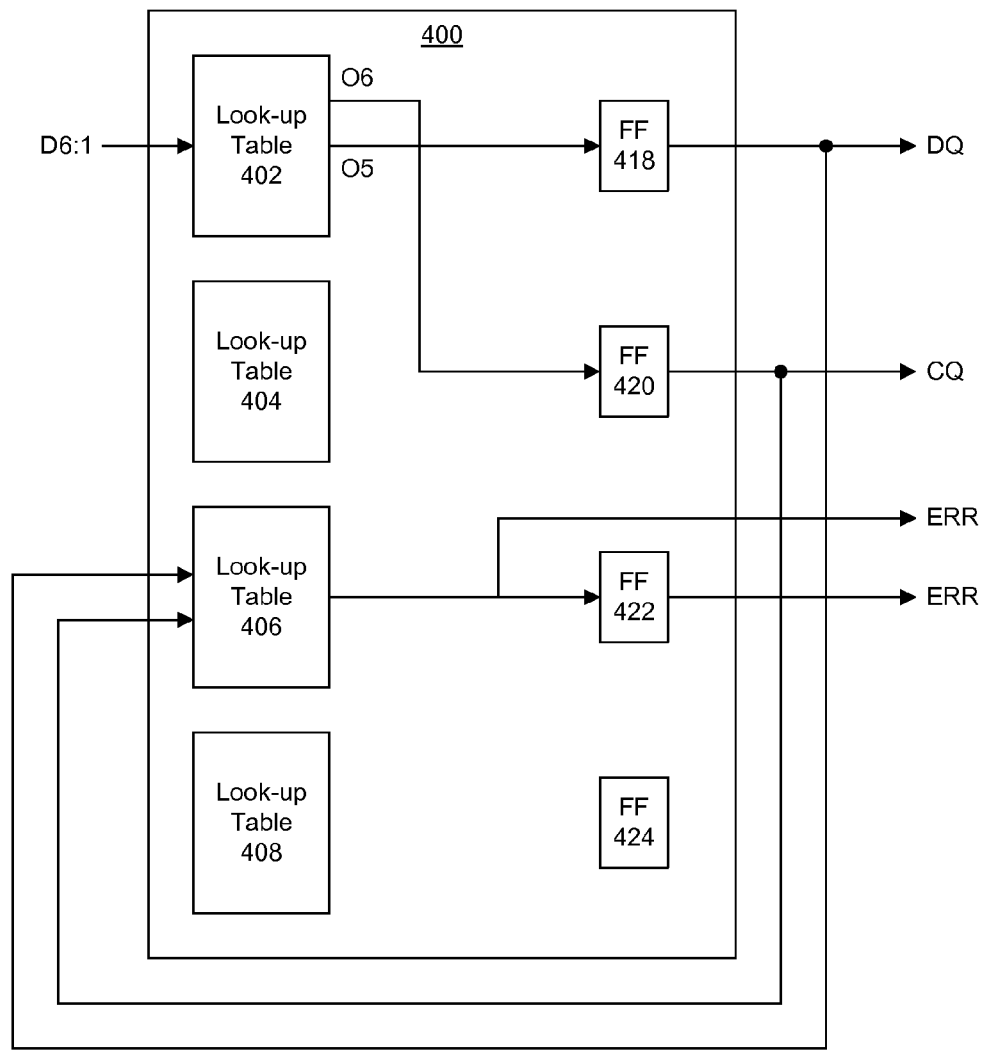
FIG. 5 is a block diagram illustrating an exemplary portion of a CLB implementing error checking for dynamic voltage scaling (DVS).

FIG. 5 is a block diagram illustrating another exemplary implementation of slice 400. Slice 400 is configured to natively implement error checking for DVS. Slice 400 may be implemented substantially as described with reference to FIG. 4. Rather than include a hardwired, instrumented flip-flop, flip-flop 418 and each other one of the flip-flops of slice 400 is implemented as a conventional or non-instrumented flip-flop. In one aspect, the instrumented memory element may be one or more of the look-up tables as described below. For purposes of illustration, not all components of slice 400 are shown. Only those components needed to illustrate the error checking functionality are depicted.

In the example of FIG. 5, look-up table 402 may be implemented, or instrumented, to generate output signals having different timing characteristics, e.g., differently timed outputs. Referring to FIG. 5, for example, look-up table 402 generates a first output referred to as O5 and a second output referred to as O6. Output O5, for example, may be implemented to be slower, e.g., have more signal propagation delay, than output O6. For example, the transistors used to implement output O5 may be sized smaller than the transistors used to implement output O6. In this regard, it should be appreciated that output O5 and output O6 are independent outputs capable of generating different, independent signals that may or may not have the same value concurrently depending upon the configuration data loaded into the programmable IC controlling slice 400. Further, while the signals illustrated in FIGS. 4 and 5 show connections among circuit elements, the actual physical signal paths may not be direct, particularly in the case of output O5, thereby having more delay than another signal path. In addition, the signal path of output O5 within look-up table 402 may be longer than that of output O6, further adding delay. For example, the signal routing of (e.g., within) the output O5 may have more delay than the signal routing of output O6.

Slice 400 may be programmed using configuration data so that output O6 and output O5 are same output signals, e.g., where the signal from output O5 is a copy of the signal from output O6 though still independently generated. Due to the implementation of look-up table 402 and/or signal routing within slice 400, output O5 may be a delayed version of output O6. The amount of delay may be approximately 100 picoseconds, though the inventive arrangements described herein are not intended to be limited by the particular amount of delay that exists on output O5.

Output O6 is provided to flip-flop 420. Output O5 is provided to flip-flop 418. The output from flip-flop 418 and the output from flip-flop 420 are provided to look-up table 406 as inputs. The routing needed to couple the output of flip-flop 418 and the output of flip-flop 420 to an input of look-up table 406 utilizes programmable circuitry, e.g., programmable interconnects and/or wires, of the programmable IC and is determined by the loading of configuration data into the programmable IC. Look-up table 406 may implement a comparator, e.g., comparator 208, and the OR circuit, e.g., OR circuit 210. The output from look-up table 406 is the error signal (ERR) and may be registered by flip-flop 422 or provided directly out from look-up table 406 and slice 400 without registering.

While FIG. 5 utilizes look-up table 402, it should be appreciated that any of the look-up tables of slice 400 may be implemented as described with reference to look-up table 402. Further, a different look-up table may be used to generate the error signal. As each of the components of slice 400 is located within a same CLB, each of the components is clocked by the same clock signal thereby maintaining accuracy for determining errors, e.g., when flip-flop 418 captures a different value, or values, than flip-flop 420.

Figure 6:
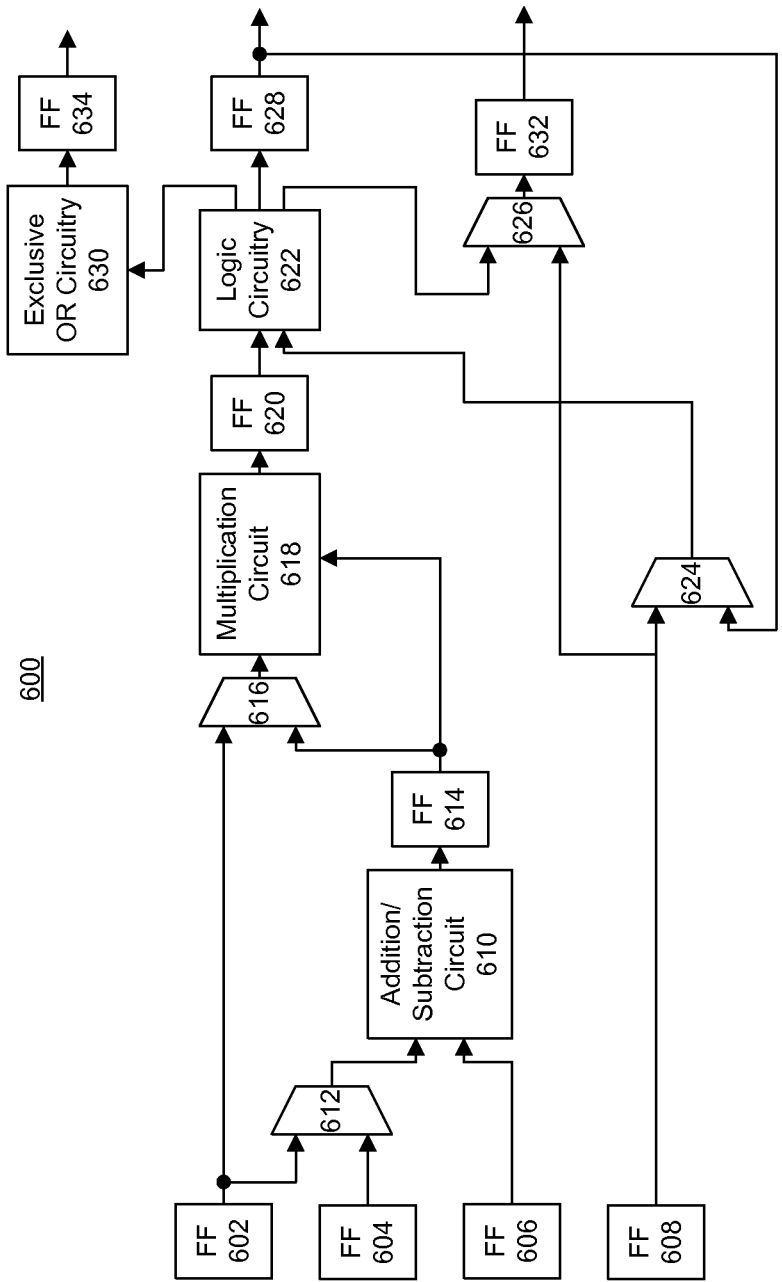
FIG. 6 is a block diagram illustrating an exemplary digital signal processing block.

FIG. 6 is a block diagram illustrating an exemplary DSP 600. DSP 600 is an exemplary implementation of DSP 106 described herein. As pictured, DSP 600 includes flip-flops 602, 604, 606, and 608. Addition/subtraction circuit 610 receives signals output from flip-flop 606 and from either flip-flop 602 or flip-flop 604 depending upon the setting of multiplexer 612. Addition/subtraction circuit 610 either adds or subtracts the received signals based upon values stored in the configuration memory cells controlling operation of addition/subtraction circuit 610.

An output from addition/subtraction circuit 610 is provided to flip-flop 614. Multiplexer 616 receives a signal output from flip-flop 614 and a signal output from flip-flop 602. Multiplexer 612 passes one of the received signals to multiplication circuit 618 as a first input thereto. Multiplication circuit 618 further receives the signal output from flip-flop 614 as a second signal and performs a multiplication operation upon the first and second received signals. An output signal from multiplication circuit 618 is provided to flip-flop 620. An output signal from flip-flop 620 is provided to logic circuitry 622.

Flip-flop 608 provides an output signal to multiplexer 624 and to multiplexer 626. Multiplexer 624 also receives a signal output from flip-flop 628. The signal passed by multiplexer 624 is provided to logic circuitry 622 as an additional input. Logic circuitry 622 may be configured to perform any of a variety of different logical operations including bit shifting operations upon the received signals. Signals output from logic circuitry 622 are provided to each of exclusive OR circuitry 630, flip-flop 628, and to an input of multiplexer 626. Multiplexer 626 passes a signal as an output to flip-flop 632, which provides an output from DSP 600. Flip-flop 628 also provides an output from DSP 600. A result from exclusive OR circuitry 630 is provided to flip-flop 634, which provides still another output from DSP 600.

The particular signals that are passed by the multiplexers, the particular operations performed by the various blocks, the logic functions, and the like are determined according to the configuration data that is loaded into configuration memory cells that control the noted circuit components of DSP 600. Further information and description for DSP 600 may be found within "UltraScale Architecture DSP Slice," UG579 (v1.1) Jul. 15, 2014, from Xilinx, Inc.

Within FIG. 6, any one or more of flip-flops 602, 604, 606, 608, 614, 620, 628, 632, and/or 634 may be implemented as a hardwired, instrumented flip-flop as described with reference to FIG. 2. The particular one or more of the flip-flops of DSP 600 selected for implementation as an instrumented flip-flop will include an additional error signal output (not shown). The error signal, or signals, may be provided to a DVS controller to be described herein in greater detail. In one aspect, the particular flip-flop or flip-flops implemented as hardwired, instrumented flip-flops may be the particular circuit block resource considered slower or slowest in the programmable circuit block. In one aspect, in the case where DSP 600 includes a plurality of hardwired, instrumented flip-flops, each such flip-flop may generate an error signal that may be provided to the DVS controller.

It should be appreciated that DSP 600 is presented for purposes of illustration only. More complex DSPs and/or less complex DSPs may be used and include one or more instrumented circuit components. In one aspect, all of the flip-flops of DSP 600 may be implemented as hardwired, instrumented flip-flops. As discussed within FIG. 6, however, this need not be the case. For example, only those flip-flops considered to be slower, or slowest within the programmable circuit block may be implemented as instrumented flip-flops.

FIG. 7 is a block diagram illustrating an exemplary IC 700 including DVS circuitry. In one aspect, IC 700 may be a programmable IC as described herein. As pictured, IC 700 includes a voltage supply 705 and a DVS controller 710. IC 700 further includes programmable circuit blocks such as CLBs 102 and DSPs 106. For purposes of discussion, DSPs 106 may be implemented with one or more hardwired, instrumented components. One or more of CLBs 102 may be implemented with one or more hardwired, instrumented components. For example, one or more or all of CLBs 102 and DSPs 106 pictured in FIG. 7 may include a hardwired, instrumented flip-flop such as a hardwired implementation of instrumented flip-flop 200. One or more or all of CLBs 102 may be implemented and configured as described with reference to FIG. 5. It should be appreciated that a mix of CLBs 102 may be included where one or more include a hardwired, instrumented flip-flop and one or more are implemented as described with reference to FIG. 6. IC 700 may also include one or more ring oscillators 300.

Each of CLBs 102, DSPs 106, and ring oscillators 300 is configured to generate and output an error signal as described. For example, the instrumented component within each of CLBs 102 and DSPs 106 may generate an error signal. With reference to CLBs 102 and DSPs 106, the error signal indicates the occurrence of an error within the programmable circuit block. Ring oscillators 300 generate an error signal that specifies frequency of operation of ring oscillators 300.

CLBs 102, DSPs 106, and/or ring oscillators 300 may be coupled to DVS controller 710. DVS controller 710 receives the error signals generated by CLBs 102, DSPs 106, and/or ring oscillators 300. The various error signals, taken collectively, specify metric data. As discussed, the metric data may include the indication of an error, an error rate, and/or frequency. In the case of error rate, DVS controller 710 may be configured to determine error rate from the error signals generated by CLBs 102 and/or DSPs 106. As defined herein, the term "error rate" means a number of errors occurring over a defined period of time as determined from an error signal.

In one aspect, DVS controller 710 may determine an error rate for each programmable circuit block. In another aspect, DVS controller 710 may determine an error rate using two or more or all of the programmable circuit blocks and/or multiple error rate signals from same programmable circuit blocks. For example, DVS controller 710 may calculate an error rate that is an average of one or more or all error rates for CLBs 102 independently, for DSPs 106 independently, or for both CLBs 102 and DSPs 106 collectively. Further, the relative contribution of error rate for CLBs 102 and/or DSPs 106 may be controlled through a weight such as a factor value between 0 and 1.

DVS controller 710 may also receive an error signal from each ring oscillator 300 specifying a frequency of oscillation. In one aspect, DVS controller may determine a frequency of oscillation using two or more or all of the ring oscillators 300. For example, DVS controller 710 may calculate a frequency of oscillation that is an average of one or more or all of the frequencies of oscillation for ring oscillators 300.

DVS controller 710 controls operation of voltage supply 705 responsive to the metric data, whether received and/or determined from received error signals. DVS controller 710 interprets the metric data and, in response thereto, provides control signals to voltage supply 705 instructing voltage supply 705 to increase or decrease voltage. In another aspect, DVS controller 710 may instruct voltage supply 705 to maintain a same or constant voltage to the various components of IC 700.

In one aspect, DVS controller 710 may compare metric data to one or more metric data thresholds. Depending upon whether the metric data exceeds the metric data threshold(s) or falls within a particular range defined by a plurality of metric data thresholds, DVS controller 710 instructs voltage supply 705 to increase the output voltage for power signal(s), decrease the output voltage of power signal(s), or maintain the same voltage for power signal(s) generated by voltage supply 705 and distributed and/or provided to the circuitry of IC 700 including CLBs 102, DSPs 106, and ring oscillators 300.

For example, DVS controller 710 may compare an error rate to an error rate threshold. Responsive to determining that the error rate exceeds the error rate threshold, DVS controller 710 may instruct voltage supply 705 to increase voltage. In another example, DVS controller 710 may, in response to a detected error from one or more of CLBs 102 and/or one or more of DSPs 106, instruct voltage supply 705 to increase voltage. In still another example, DVS controller 710 may compare a frequency of oscillation with a threshold frequency of oscillation. Responsive to determining that the frequency of oscillation does not exceed the threshold frequency of oscillation, DVS controller 710 may instruct voltage supply 705 to increase voltage by a particular amount.

In one aspect, DVS controller 710 may be formed using one or more programmable circuit blocks as described herein with reference to FIG. 1. For example, DVS controller 710 may be formed within IC 700 responsive to loading a configuration bitstream into appropriate configuration memory cells of IC 700 specifying an implementation of DVS controller 710. In another aspect, DVS controller 710 may be hardwired. Whether DVS controller 710 is hardwired or formed using one or more programmable circuit blocks, error signals may be routed to inputs of DVS controller 710 using programmable circuitry. In other cases, e.g., where the DVS circuit structures are hardwired, error signals may be routed to inputs of DVS controller 710 using programmable circuitry or using dedicated, hardwired, routing resources (e.g., wires).

Voltage supply 705 is operable to provide a varying voltage level as a power signal to the various circuit blocks illustrated in FIG. 7. Voltage supply 705 varies the voltage that is output as a power signal responsive to the control signals received from DVS controller 710. In one aspect, IC 700 may be partitioned to include two or more different DVS zones where the voltage provided to components within a first DVS zone through power signals may be controlled independently of the voltage provided to components within a second and different DVS zone through power signals. For purposes of illustration, IC 700 includes a single DVS zone in which CLBs 102, DSPs 106, and ring oscillators 300 each receive a same voltage level from voltage supply 705.

The example of FIG. 7 utilizes error signals from CLBs 102, DSPs 106, and/or ring oscillators 300. In one aspect, DVS controller 710 may control voltage of voltage supply 705 using only metric data derived from CLBs 102, only metric data derived from DSPs 106, only metric data derived from CLBs 102 and DSPs 106, only metric data derived from ring oscillators 300, only metric data derived from ring oscillators 300 and CLBs 102, or only metric data derived from DSPs 106 and ring oscillators 300.

FIG. 8 is a flow chart illustrating an exemplary method of operation of an apparatus including DVS enabled circuitry. In one aspect, the apparatus may be an IC or a programmable IC as described herein with reference to FIGS. 1 and/or 7.

In block 805, the apparatus begins operating. For example, an IC or other electronic system including DVS enabled circuitry begins operation. The DVS enabled circuitry begins generating metric data and providing the metric data to the DVS controller. In block 810, the DVS controller receives the metric data and optionally calculates additional metric data. As described within this disclosure, metric data includes one or more error signals generated by instrumented memory elements such as instrumented flip-flops and ring oscillators. The DVS controller may optionally calculate additional metric data such as an error rate for one or more of the DVS enabled structures or a combination of DVS enabled structures.

In block 815, the DVS controller determines voltage adequacy using the metric data. In general, frequency of an output signal generated by a ring oscillator is inversely correlated with error rates of circuitry as voltage is lowered. The error rate of circuitry is inversely correlated with the voltage of a power signal provided to the circuitry. This means that as voltage of a power signal provided to circuitry is lowered, the error rate of the circuitry may increase particularly as the voltage is decreased lower than a selected voltage threshold. Concurrently, frequency of an output signal generated by a ring oscillator decreases. The frequency of the output signal is directly correlated with the voltage of the power signal.

As defined herein, the term "correlation" means that two or more items, e.g., quantities, have a mutual relationship or connection where one item affects or depends on the other. As defined herein, the term "direct correlation" means that as one item increases, the directly correlated item also increases. Direct correlation means that two items generally move in the same direction as one another. As defined herein, the term "inverse correlation" means that is one item decreases (increases), the inversely correlated item increases (decreases). Inverse correlation means that two items generally move in opposition to one another.

The DVS controller may determine adequacy of the voltage of the power signal in any of a variety of different ways. In one aspect, the system may compare the frequency of an error signal from a ring oscillator or a frequency derived from a plurality of error signals with a plurality of frequency thresholds defining different frequency ranges representing different error rates. A frequency above a first, higher frequency threshold may indicate that the voltage may be decreased. A frequency below a second, lower frequency threshold may indicate that the voltage should be increased. In another aspect, a frequency equal to the first or second frequency thresholds or between the first and second frequency thresholds may mean that the current voltage level should be maintained.

In another aspect, the frequency of the error signal from the ring oscillator or a frequency derived from a plurality of error signals may be compared with a single frequency threshold. In that case, the voltage of the power signal may be increased responsive to determining that the frequency is below the frequency threshold. The voltage of the power signal may be decreased response to determining that the frequency is above the frequency threshold. The voltage of the power signal may be maintained at the current level responsive to determining that the frequency is equal to the frequency threshold.

In another aspect, the system may determine whether an error is detected from one or more of the instrumented memory elements. An error indicates that the voltage should be increased. When no error is detected, the voltage may be decreased or maintained at a current voltage level.

In another aspect, the system may compare the error rate of one or more error signals generated by one or more instrumented memory elements or an error rate derived from a plurality of error signals with a plurality of error rate thresholds. An error rate above a first, higher error rate threshold indicates that the voltage should be increased. An error rate below a second, lower error rate threshold indicates that the voltage may be decreased. In another aspect, a frequency equal to either the first or second error rate thresholds or between the first and second error rate thresholds may mean that the current voltage level should be maintained.

In another aspect, the system may compare the error rate of one or more error signals generated by one or more instrumented memory elements or an error rate derived from a plurality of error signals with a single error rate threshold. In that case, the voltage of the power signal may be decreased responsive to determining that the error rate is below the error rate threshold. The voltage of the power signal may be increased responsive to determining that the error rate is above the error rate threshold. The voltage of the power signal may be maintained at the current level responsive to determining that the error rate is equal to the error rate threshold.

Accordingly, based upon the determination and comparisons described with reference to block 820, method 800 proceeds to either block 825 where voltage level of the power signal is increased, to block 830 where the current voltage level of the power signal is maintained, or to block 835 where the voltage level of the power signal is decreased.

After any one of blocks 825, 830, or 835, method 800 loops back to block 810 to continue processing an regulating voltage of the power signal within the apparatus.

In accordance with the inventive arrangements disclosed herein, a circuit design may also be processed to incorporate DVS circuitry. For example, circuit structures such as the instrumented memory elements may be implemented using programmable circuitry, e.g., two or more CLBs, to create an additional delay signal path and comparators as described. Such structures may be incorporated into a circuit design automatically using EDA tools. Including DVS structures formed of programmable circuitry within a circuit design automatically using EDA tools may be particularly useful in cases where the target IC does not include instrumented circuit components. In other cases, signal paths of a circuit design may be intentionally routed through hardwired versions of instrumented memory elements, whether within a CLB as described with reference to FIGS. 3 and/or 4, a DSP, or another programmable circuit block. Further, a DVS controller may be inserted or included in a circuit design to monitor for errors, error rates, and/or frequencies as described. For example, the DVS controller may be implemented using programmable circuit blocks as a result of loading configuration data into the programmable IC.

Figure 9:
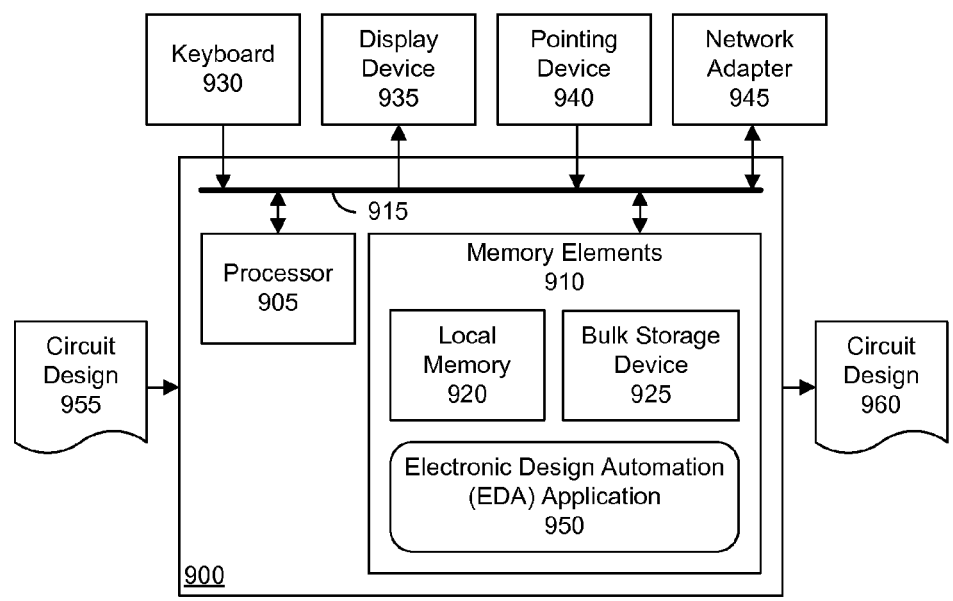
FIG. 9 is a block diagram illustrating an exemplary data processing system.

FIG. 9 is a block diagram illustrating an exemplary data processing system (system) 900. System 900 may be used to process a circuit design to implement one or more DVS structures as described herein and/or implement a DVS enabled architecture as described herein.

In the example of FIG. 9, system 900 includes at least one processor, e.g., a central processing unit (CPU), 905 coupled to memory elements 910 through a system bus 915 or other suitable circuitry. System 900 stores program code within memory elements 910. Processor 905 executes the program code accessed from memory elements 910 via system bus 915. In one aspect, system 900 is implemented as a computer or other data processing system that is suitable for storing and/or executing program code. It should be appreciated, however, that system 900 may be implemented in the form of any system including a processor and memory that is capable of performing the functions described within this disclosure. Further, system 900 may be implemented as one or more networked data processing systems.

Memory elements 910 include one or more physical memory devices such as, for example, a local memory 920 and one or more bulk storage devices 925. Local memory 920 refers to random access memory (RAM) or other non-persistent memory device(s) generally used during actual execution of the program code. Bulk storage device 925 may be implemented as a hard disk drive (HDD), solid state drive (SSD), or other persistent data storage device. System 900 may also include one or more cache memories (not shown) that provide temporary storage of at least some program code in order to reduce the number of times program code must be retrieved from bulk storage device 925 during execution.

Input/output (I/O) devices such as a keyboard 930, a display device 935, and a pointing device 940 may optionally be coupled to system 900. The I/O devices may be coupled to system 900 either directly or through intervening I/O controllers. A network adapter 945 may also be coupled to system 900 to enable system 900 to become coupled to other systems, computer systems, remote printers, and/or remote storage devices through intervening private or public networks. Modems, cable modems, Ethernet cards, and wireless transceivers are examples of different types of network adapter 945 that may be used with system 900.

As pictured in FIG. 9, memory elements 910 store an EDA application 950. EDA application 950, being implemented in the form of executable program code, is executed by system 900. As such, EDA application 950 is considered an integrated part of system 900. System 900, while executing EDA application 950, may receive and operate upon a circuit design 955. Circuit design 955 is a programmatic description of circuitry to be implemented within an IC. For example, circuit design 955 may be specified using a hardware description language, as a netlist, as a configuration bitstream, a combination thereof, or the like.

System 900 operates upon circuit design 955 to implement one or more of the circuit structures described herein and/or to implement DVS within circuit design 955. System 900, in executing EDA application 950, may add one or more circuit structures to circuit design 955, may place and/or route circuit design 955 to utilize instrumented circuit components as described herein, may include a DVS controller, or the like. System 900 generates and outputs a processed version of circuit design 955 as circuit design 960.

EDA application 950, circuit design 955, circuit design 960, and any data items used, generated, and/or operated upon by EDA application 950 are functional data structures that impart functionality when employed as part of system 900 or when such elements, including derivations thereof, are loaded into an IC such as a programmable IC.

Figure 10:
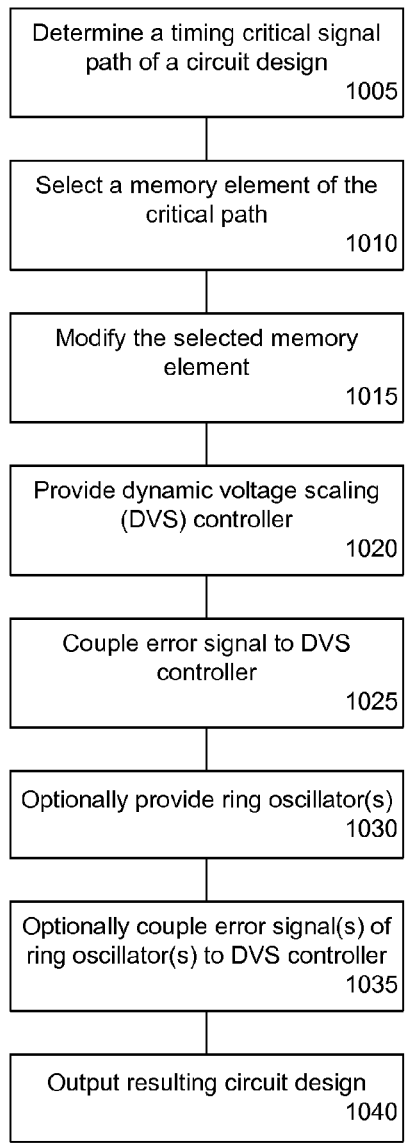
FIG. 10 is a flow chart illustrating an exemplary method of processing a circuit design for performing DVS.

FIG. 10 is a flow chart illustrating an exemplary method 1000 of processing a circuit design for performing DVS. Method 1000 may be implemented using system 900 of FIG. 9 by operating upon a circuit design such as circuit design 955.

In block 1005, the system determines a timing critical signal path of a plurality of signal paths of the circuit design. A signal path is the path in the circuit taken by a signal between a source circuit element (source) and a sink circuit element (sink). Typically, the source and the sink are clocked, or synchronous, circuit elements. A signal path is said to be critical when the estimated amount of time, i.e., the estimated delay, for a signal to propagate from the source to the sink is greater than the amount of time permitted for the signal to propagate from source to sink per the circuit design specification. In block 1010, the system selects a memory element such as a flip-flop in the timing critical data path. The memory element that is selected may be a non-instrumented memory element. In block 1015, the system modifies the selected memory element. The selected memory element may be replaced with an instrumented version of the memory element.

In block 1020, the system provides a DVS controller. For example, the system may insert a DVS controller circuit block or intellectual property block into the circuit design. In block 1025, the system couples the error signal output from the instrumented memory element to the DVS controller. For example, the system may route the error signal output from the instrumented memory element to an input of the DVS controller.

In block 1030, the system optionally provides a ring oscillator. For example, the system may insert a ring oscillator circuit block or intellectual property block into the circuit design. In some cases, the particular target IC in which the circuit design will be implemented may include one or more hardwired ring oscillators. In such cases, the system need not insert ring oscillator circuit blocks and/or ring oscillator intellectual property blocks. In other cases, the system may form one or more ring oscillators using programmable circuitry of the IC. In block 1035, the system couples the error signal from the one or more ring oscillators to input(s) of the DVS controller. For example, the output signal generated by one or more selected ring oscillators may be routed to inputs of the DVS controller.

In block 1040, the system outputs the resulting circuit design. As defined herein, the term "output" and/or derivatives thereof mean storing in a computer readable storage medium, e.g., a memory, sending over a communication link including a network and/or wired communication links, displaying upon a display device, or the like.

Figure 11:
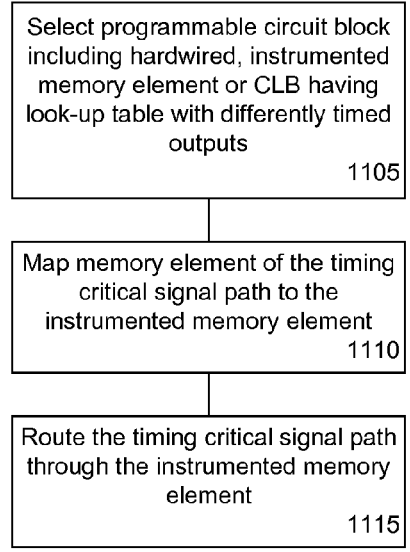
FIG. 11 is a flow chart illustrating an exemplary method of implementing block 1015 of FIG. 10.

FIG. 11 is a flow chart illustrating an exemplary method of implementing block 1015 of FIG. 10. FIG. 11 illustrates a series of operations that may be performed by the system of FIG. 9 to modify the selected memory element. FIG. 11 illustrates an example where the selected memory element is modified using an instrumented memory element, e.g., a flip-flop or a look-up table, that is hardwired as described with reference to FIG. 2 and/or a CLB as described with reference to either FIG. 4 or 5.

In block 1105, the system selects a programmable circuit block implemented as a DVS circuit structure. The selected programmable circuit block is one that is available on the target IC in which the circuit design will be implemented. For example, the selected programmable circuit block may be a CLB as described with reference to FIG. 4 or 5 having an instrumented memory element, a DSP including an instrumented memory element as described herein, or the like.

In block 1110, the system maps, e.g., technology maps, the memory element of the timing critical signal path to the instrumented memory element of the selected programmable circuit block in the case of a CLB as described in FIG. 4 or to the slice of a CLB as described in FIG. 5. Mapping, or technology mapping, as the case may be, refers to a process where a high level description of a circuit design is mapped, or correlated, with a particular technology library. For example, constructs of the circuit design are assigned to particular circuit components or circuit blocks available on the target IC in which the circuit design is to be implemented. In block 1115, the system routes the timing critical signal path through the instrumented memory element or establishes the connections between look-up tables and flip-flops as shown in FIG. 5. It should be appreciated that at least with respect to the slice illustrated in FIG. 5, appropriate configuration data must be generated and included in the circuit design that may be loaded into the look-up tables to implement the proper functions therein, e.g., to generate same signals on outputs O5 and O6 and to implement the comparison and OR circuitry previously described.

Figure 12:
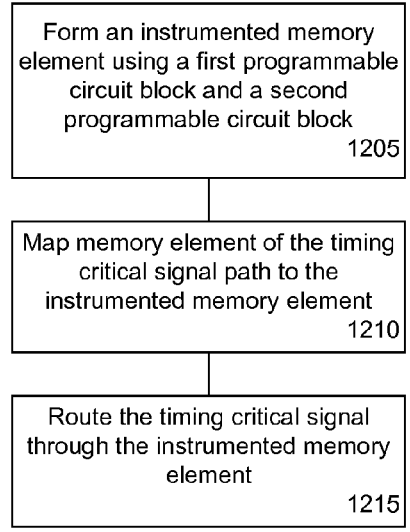
FIG. 12 is a flow chart illustrating another exemplary method of implementing block 1015 of FIG. 10.

FIG. 12 is a flow chart illustrating another exemplary method of implementing block 1015 of FIG. 10. FIG. 12 illustrates a series of operations that may be performed by the system of FIG. 9 to modify the selected memory element using an instrumented memory element that is implemented using programmable circuitry of a programmable IC.

In block 1205, the system forms or implements an instrumented memory element such as an instrumented flip-flop using a first programmable circuit block and a second programmable circuit block. The first and second programmable circuit blocks may include only non-instrumented memory elements or only non-instrumented flip-flops. Referring to the exemplary flip-flop of FIG. 3, for example, the system may use a first CLB to implement the first flip-flop of the instrumented flip-flop and a second CLB to implement the delay of the data signal and the second flip-flop of the instrumented flip-flop.

In block 1210, the system maps, e.g., technology maps, the memory element of the timing critical signal path to the instrumented memory element implemented using the programmable circuitry of the target programmable IC. In block 1215, the system routes the timing critical signal path through the instrumented memory element. It should be appreciated that appropriate configuration data may be generated and included in the circuit design that may be loaded into the look-up tables to implement the proper functions therein for the CLBs.

The inventive arrangements described within this disclosure provide various DVS structures, architectures, and processing techniques. In some cases, existing programmable circuit blocks may be modified to include a hardwired, instrumented memory element. In other cases, ring oscillators may be used. The instrumented memory elements and/or the ring oscillators provide error signals that may be used to regulate the voltage of power signals within an IC.

In other aspects, a circuit design may be processed to identify timing critical signal paths. Those signal paths may be implemented using one or more of the various DVS structures described herein. For example, the timing critical signal paths may be implemented using an instrumented memory element, whether hardwired within a programmable circuit block or implemented using one or more programmable circuit blocks of an IC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

As defined herein, the term "automatically" means without user intervention. As defined herein, the term "user" means a human being. The term "and/or" as defined herein means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure may be realized in hardware or a combination of hardware and software. One or more aspects may be realized in a centralized fashion in one system or in a distributed fashion where different elements are spread across several interconnected systems. Any kind of data processing system or other apparatus adapted for carrying out at least a portion of the methods described herein is suited.

One or more aspects further may be embedded in a computer program product, which includes all the features enabling the implementation of the methods described herein. The computer program product includes a computer-readable data storage medium. As defined herein, the phrase "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code may include, but is not limited to, a subroutine, a function, a procedure, an object method, an object implementation, an executable application, an applet, a servlet, source code, object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the registers of the computer system and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

An apparatus may include a first programmable circuit block having a plurality of programmable circuit elements. The plurality of programmable circuit elements may include a hardwired, instrumented memory element. The hardwired, instrumented memory element may include a first flip-flop configured to receive a data signal, a delay circuit configured to generate a delayed version of the data signal, a second flip-flop identical to the first flip-flop and configured to receive the delayed version of the data signal, a comparator configured to compare an output signal from the first flip-flop and an output signal from the second flip-flop, and an error signal generator configured to generate an error signal responsive to a mismatch of bits between the output signal from the first flip-flop and the output signal from the second flip-flop.

In one aspect, the instrumented memory element may be one determined to be a slower circuit element compared to at least one other of the plurality of programmable circuit elements of the first programmable circuit block.

In another aspect, the instrumented memory element may be within a signal path of the first programmable circuit block determined to be slower than at least one other signal path through the first programmable circuit block.

The apparatus may be a programmable IC with the first programmable circuit block being a CLB. The apparatus may be a programmable IC with the first programmable circuit block being a DSP.

The apparatus may also include a second programmable circuit block of a same type as the first programmable circuit block. The second programmable circuit block may include only non-instrumented memory elements.

The apparatus further may include a DVS controller configured to vary a voltage of a power signal provided to the first programmable circuit block responsive to the error signal. The DVS controller may be configured to determine an error rate from the error signal and vary a voltage of a power signal provided to the first programmable circuit block responsive to the error rate.

The apparatus may also include a ring oscillator configured to generate an error signal having a frequency inversely correlated with an error rate of circuitry within the apparatus. The DVS controller may be configured to vary the voltage of the power signal according to the frequency of the error signal from the ring oscillator.

An apparatus may include circuitry operable over a range of voltages of a power signal and a ring oscillator configured to generate an error signal having a frequency inversely correlated with an error rate of at least a portion of the circuitry. The error rate may be inversely correlated with a voltage of the power signal. The apparatus also may include a DVS controller configured to vary the voltage of the power signal responsive to the frequency of the error signal from the ring oscillator.

In one aspect, the circuitry may include a programmable circuit block having a plurality of programmable circuit elements. The plurality of programmable circuit elements may include a hardwired, instrumented memory element. The hardwired, instrumented memory element may include a first flip-flop configured to receive a data signal, a delay circuit configured to generate a delayed version of the data signal, a second flip-flop identical to the first flip-flop and configured to receive the delayed version of the data signal, and a comparator configured to compare an output signal from the first flip-flop and an output signal from the second flip-flop. The hardwired, instrumented memory element also may include an error signal generator configured to generate an error signal responsive to a mismatch of bits between the output signal from the first flip-flop and the output signal from the second flip-flop.

The DVS controller may be configured to vary the voltage of the power signal responsive to the error signal from the instrumented memory element. In one aspect, the DVS controller may be configured to vary the voltage of the power signal responsive to an error rate determined from the error signal from the instrumented memory element.

A programmable circuit block may include a first look-up table having a first output and a second output, a first flip-flop configured to receive a first signal from the first output of the first look-up table, and a second flip-flop configured to receive a second signal from the second output of the first look-up table. The first signal may be a delayed version of the second signal. The programmable circuit block may also include a second look-up table configured to receive an output signal from the first flip-flop and an output signal from the second flip-flop. The second look-up table may be configured to generate an error signal responsive to a mismatch of bits between the output signal from the first flip-flop and the output signal from the second flip-flop.

The first look-up table, the second look-up table, the first flip-flop, and the second flip-flop may be clocked by a same clock signal.

In one aspect, the first output of the first look-up table may be formed using at least one transistor of a smaller size than transistors implementing the second output of the first look-up table.

In another aspect, the signal routing of the first output of the first look-up table may have more delay than the signal routing of the second output of the first look-up table.

The first look-up table may receive a timing critical signal as an input.

The programmable circuit block may be implemented as a CLB. For example, the programmable circuit block may be configured by loading configuration data into configuration memory cells of an IC including the CLB.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. An apparatus, comprising:
a first programmable circuit block comprising a plurality of programmable circuit elements;
wherein the plurality of programmable circuit elements comprise a hardwired, instrumented memory element comprising:
a first flip-flop configured to receive a data signal;
a delay circuit configured to generate a delayed version of the data signal;
a second flip-flop identical to the first flip-flop and configured to receive the delayed version of the data signal;
a comparator configured to compare an output signal from the first flip-flop and an output signal from the second flip-flop; and
an error signal generator configured to generate an error signal responsive to a mismatch of bits between the output signal from the first flip-flop and the output signal from the second flip-flop.

2. The apparatus of claim 1, wherein the instrumented memory element is determined to be a slower circuit element compared to at least one other of the plurality of programmable circuit elements of the first programmable circuit block.

3. The apparatus of claim 1, wherein the instrumented memory element is within a signal path of the first programmable circuit block determined to be slower than at least one other signal path through the first programmable circuit block.

4. The apparatus of claim 1, wherein the apparatus is a programmable integrated circuit and the first programmable circuit block is a configurable logic block.

5. The apparatus of claim 1, wherein the apparatus is a programmable integrated circuit and the first programmable circuit block is a digital signal processing block.

6. The apparatus of claim 1, further comprising:
a second programmable circuit block of a same type as the first programmable circuit block;
wherein the second programmable circuit block comprises only non-instrumented memory elements.

7. The apparatus of claim 1, further comprising:
a dynamic voltage scaling controller configured to vary a voltage of a power signal provided to the first programmable circuit block responsive to the error signal.

8. The apparatus of claim 7, wherein the dynamic voltage scaling controller is configured to determine an error rate from the error signal and vary a voltage of a power signal provided to the first programmable circuit block responsive to the error rate.

9. The apparatus of claim 7, further comprising:
a ring oscillator configured to generate an error signal having a frequency inversely correlated with an error rate of circuitry within the apparatus;
wherein the dynamic voltage scaling controller is configured to vary the voltage of the power signal according to the frequency of the error signal from the ring oscillator.

10. An apparatus, comprising:
circuitry operable over a range of voltages of a power signal;
a ring oscillator configured to generate an error signal having a frequency inversely correlated with an error rate of at least a portion of the circuitry;
wherein the error rate is inversely correlated with a voltage of the power signal; and
a dynamic voltage scaling controller configured to vary the voltage of the power signal responsive to the frequency of the error signal from the ring oscillator.

11. The apparatus of claim 10, wherein the circuitry comprises:
a programmable circuit block comprising a plurality of programmable circuit elements;
wherein the plurality of programmable circuit elements comprise a hardwired, instrumented memory element comprising:
a first flip-flop configured to receive a data signal;
a delay circuit configured to generate a delayed version of the data signal;
a second flip-flop identical to the first flip-flop and configured to receive the delayed version of the data signal;
a comparator configured to compare an output signal from the first flip-flop and an output signal from the second flip-flop; and
an error signal generator configured to generate an error signal responsive to a mismatch of bits between the output signal from the first flip-flop and the output signal from the second flip-flop.

12. The apparatus of claim 11, wherein the dynamic voltage scaling controller is configured to vary the voltage of the power signal responsive to the error signal from the instrumented memory element.

13. The apparatus of claim 12, wherein the dynamic voltage scaling controller is configured to vary the voltage of the power signal responsive to an error rate determined from the error signal from the instrumented memory element.

* * * * *